United States Patent [19]
Niibe et al.

[11] Patent Number: 5,390,228
[45] Date of Patent: Feb. 14, 1995

[54] METHOD OF AND APPARATUS FOR STABILIZING SHAPES OF OBJECTS, SUCH AS OPTICAL ELEMENTS, AS WELL AS EXPOSURE APPARATUS USING SAME AND METHOD OF MANUFACTURING SEMICONDUCTOR DEVICES

[75] Inventors: Masahito Niibe, Atsugi; Yasuaki Fukuda, Hadano; Masami Hayashida, Yokohama, all of Japan

[73] Assignee: Canon Kabushiki Kaisha, Tokyo, Japan

[21] Appl. No.: 270,794

[22] Filed: Jul. 5, 1994

Related U.S. Application Data

[63] Continuation of Ser. No. 940,846, Sep. 4, 1992, abandoned.

[30] Foreign Application Priority Data

Sep. 7, 1991 [JP] Japan .................................. 3-255800
Jan. 13, 1992 [JP] Japan .................................. 4-023262

[51] Int. Cl.6 ............................................. G21K 5/02
[52] U.S. Cl. .................................... 378/34; 378/84; 378/35; 250/492.1; 359/846
[58] Field of Search ................. 378/34, 35, 43, 84, 378/85, 146; 250/492.2, 492.1, 443.1; 359/846

[56] References Cited

U.S. PATENT DOCUMENTS

| | | | |
|---|---|---|---|
| 4,852,133 | 7/1989 | Ikeda et al. ................. | 378/34 |
| 4,969,168 | 11/1990 | Sakamoto et al. ............ | 378/34 |
| 5,004,319 | 4/1991 | Smither ....................... | 378/84 |
| 5,052,033 | 9/1991 | Ikeda et al. . | |
| 5,063,582 | 11/1991 | Mori et al. .................. | 378/34 |
| 5,138,643 | 8/1992 | Sakamoto et al. ............ | 378/34 |

FOREIGN PATENT DOCUMENTS

| | | | |
|---|---|---|---|
| 0112329 | 7/1983 | Japan ................... | 378/34 |
| 64-41215 | 2/1989 | Japan . | |
| 1175731 | 7/1989 | Japan . | |

OTHER PUBLICATIONS

T. Oversluizen, et al., "Performance of a Directly Water-Cooled Silicon Crystal for Use in High-Power Synchrotron Radiation Applications", Rev. Sci. Instrum. vol. 60, No. 7, pp. 1493–1500 (Jul. 1989).

A. M. Hawryluk, et al., "Reflection Mask Technology for X-ray Projection Lithography", Journal of Vacuum Science & Technology, B7, No. 6, pp. 1702–1704 (Nov./Dec. 1989).

K. Asch, et al., "Method of Keeping a Proximity Printing Mask at a Constant Temperature", IBM Technical Disclosure Bulletin, vol. 26, No. 7A, p. 3261 (Dec. 1983).

*Primary Examiner*—David P. Porta
*Attorney, Agent, or Firm*—Fitzpatrick, Cella, Harper & Scinto

[57] ABSTRACT

A temperature distribution of an object, such as an optical element, onto which radiation energy is irradiated, is measured. The change of the shape of the object is controlled by varying the temperature of a part of the object on the basis of the measured temperature distribution to stabilize the shape of the object. Also, the shape of the object being irradiated is stabilized by causing the same temperature distribution in the object when in the thermally stable condition to be generated in the object while it is being irradiated. If the shapes of masks used to manufacture semiconductor devices are stabilized by using the above methods, highly integrated semiconductor devices can be manufactured.

21 Claims, 9 Drawing Sheets

METHOD OF AND APPARATUS FOR STABILIZING SHAPES OF OBJECTS, SUCH AS OPTICAL ELEMENTS, AS WELL AS EXPOSURE APPARATUS USING SAME AND METHOD OF MANUFACTURING SEMICONDUCTOR DEVICES

This application is a continuation of application Ser. No. 07/940,846, filed Sep. 4, 1992, now abandoned.

BACKGROUND OF THE INVENTION

1. Field of the Invention

The present invention relates to a method of stabilizing shapes of optical elements and an optical apparatus employing the same. More particularly, the present invention relates to a method of stabilizing shapes of optical elements which prevents shape changes caused by local temperature changes and which is intended for use with synchrotron radiation light or high-intensity light beams which are widely used for physics and chemistry research, analysis apparatuses, manufacturing apparatuses or the like, and to an optical apparatus employing the same.

2. Description of the Related Art

In recent years, a light source which emits synchrotron radiation (SR) light or high-intensity light beams, such as excimer laser beams, has been developed. Optical apparatuses using such a light source for physics and chemistry research, analysis apparatuses, manufacturing apparatuses or the like have lately attracted attention, and a lot of research and development of these apparatuses has been performed.

Generally, optical apparatuses require various types of optical elements for the purposes of reflection, transmission, light condensation, diffraction, spectrophotometry, polarization, image formation or the like. Since the intensity of light beams used is high in these optical apparatuses, which use, in particular, a high-intensity light source, phenomena such as deformation, performance deterioration, irradiation damage, or destruction of optical elements occur.

An example of such high intensity light beams concerns the SR light technology field, where the radiation power from a light source has recently reached the order of kilowatts as the result of advancements made in the technology regarding what is commonly called insertion type light sources, such as multi-pole wigglers or undulators.

Radiation ranging from X-rays to electromagnetic waves in vacuum ultraviolet rays are often used regarding radiation lengths from a light source. To prevent attenuation in the atmosphere, in most cases, the optical elements are installed in a vacuum vessel or a vacuum beam line. As a result, heat radiation by conduction or convection to the atmosphere does not occur in optical elements placed in a vacuum. Thus, there is a tendency for the temperature of optical elements to increase much more than when they are placed in the atmosphere.

To be specific, in a semiconductor exposure apparatus which uses synchrotron radiation light or high-intensity illumination light from an excimer laser or the like, heat strain caused by temperature changes or temperature distribution changes of mirrors or lenses which reflect, converge, and enlarge illumination light, or caused by reticles or masks, becomes a major obstacle to the improvement of accuracy of the semiconductor exposure apparatus. In particular, when electromagnetic waves, such as synchrotron radiation light or vacuum ultraviolet rays, are used, optical systems, such as mirrors or lenses, and masks are generally placed in a vacuum chamber or a pressure reduction chamber in order to prevent the attenuation of the energy of illumination light. If members to be illuminated, such as mirrors, lens, or masks, are heated by illumination light, the temperature increases considerably because there is hardly any conduction by atmosphere gas or heat radiation by convection. Heat strain caused by temperature changes or changes in temperature distribution considerably changes the distribution of intensity of illumination light, causing exposure irregularities.

For this reason, various methods for cooling the above-mentioned members to be illuminated by using a water cooling jacket or the like have been developed. An example thereof is described in "Rev. Sci. Instrum. 60, 1493 (1989), T. Oversluizen, et al.".

However, in an optical apparatus using a light source which emits high-intensity light beams, even if optical elements are cooled, the temperature of the surfaces of the optical elements continues to vary usually by several to several tens of degrees. As a result, the shapes of the optical elements slightly change their forms, and there are some cases in which the optical performance of the optical apparatuses deteriorates.

For example, in a projection exposure apparatus for transferring fine patterns for use in the manufacturing of semiconductor devices, it is required that temperature variations of optical elements, such as mirrors, be controlled to approximately 1/100° C. However, in the prior art, the cooling of optical elements alone is not sufficient to control the temperature variations of the optical elements to approximately 1/100° C.

SUMMARY OF THE INVENTION

An object of the present invention is to provide a method and apparatus which is capable of effectively correcting temperature variations of optical elements when a light source which emits high-intensity light beams is used, preventing the deformation of optical elements due to heat strain, and easily preventing the deterioration of optical performance.

Another object of the present invention is to provide a method of manufacturing highly integrated semiconductor devices.

In accordance with one aspect of the invention, a method of stabilizing shapes of objects comprises the steps of measuring a temperature distribution of an object being irradiated with radiation energy, and causing the temperature of a part of the object to be changed on the basis of the measurement to control the change of the shape of the object.

In accordance with another aspect of the invention, a method of stabilizing shapes of objects comprises the steps of determining a temperature distribution of a mask in a thermally stable state, and controlling the temperature distribution of the mask being irradiated with radiation energy to be the same as the temperature distribution in the thermally stable state.

In accordance with still another aspect of the invention, an optical apparatus comprises an optical element, means for irradiating the optical element with radiation energy, measuring means for measuring the temperature distribution of the irradiated optical element, and temperature control means for changing the temperature of a part of the optical element based on a measurement by the measuring means.

In accordance with another aspect of the invention, an exposure apparatus comprises transfer means for exposing and transferring an exposure pattern to an object to be exposed by irradiating exposure energy onto a mask having an exposure pattern formed thereon, measuring means for measuring the temperature distribution of the mask, and temperature control means for changing the temperature of part of the mask on the basis of the measurement by the measuring means.

In accordance with yet another aspect of the invention, a method of manufacturing semiconductor devices and semiconductor devices made by the steps of preparing a reflection type mask having a circuit pattern formed thereon, measuring the temperature distribution of the mask, changing the temperature to obtain a substantially uniform temperature distribution of the mask, and exposing and transferring a circuit pattern of the mask onto a wafer by irradiating the mask with exposure energy.

In accordance with another aspect of the invention, a method of manufacturing semiconductor devices and semiconductor devices made by the steps of preparing a reflection type mask having a circuit pattern formed thereon, determining a temperature distribution of the mask in a thermally stable state when the mask is being irradiated before the mask is irradiated with exposure energy, and exposing and transferring a circuit pattern of the mask onto a wafer by irradiating the mask with exposure energy.

Objectives and advantages in addition to those discussed above shall be apparent to those skilled in the art from the description of the preferred embodiments of the invention which follow. In the description, reference is made to the accompanying drawings, which form a part hereof, and which illustrate examples of the invention. Such examples, however, are not exhaustive of the various embodiments of the invention, and therefore reference is made to the appended claims for determining the scope of the invention.

DESCRIPTION OF THE PREFERRED EMBODIMENTS

First Embodiment

Figure 1:
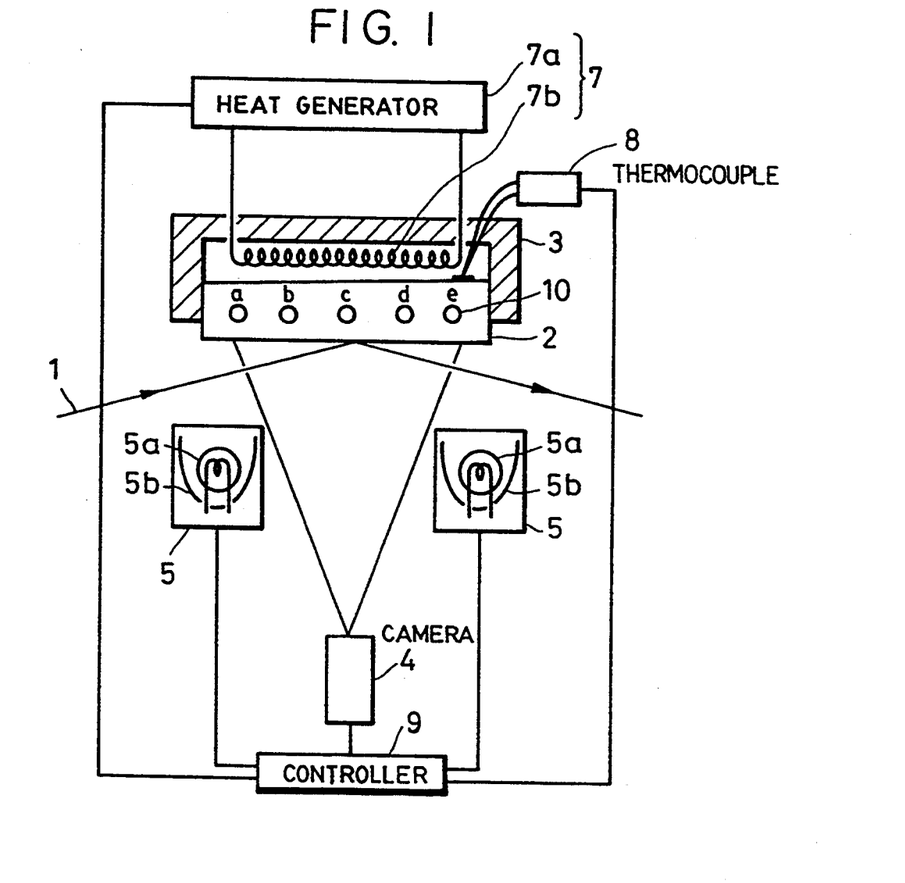
FIG. 1 is a schematic view illustrating an essential portion of a first embodiment of the present invention.

FIG. 1 is a schematic view illustrating an essential portion of one part of the first embodiment in which the present invention is applied to an optical apparatus which is intended for use with synchrotron radiation light.

Each of the elements shown in block outline in FIG. 1, as well as in the other figures, is well known per se, and a specific type of construction is not critical to carrying out the invention or to a disclosure of the best mode for carrying out the invention.

In this figure, reference numeral i denotes synchrotron radiation light; reference numeral 2 denotes an optical element which is formed of a light condensing mirror, on the surface of which multilayer films for reflecting soft X-rays are formed after polishing a silicon carbide (SIC) member into net form and which reflects the synchrotron radiation light 1 and condenses it into a point. Reference numeral 3 denotes a holder for holding the light condensing mirror; reference numeral 4 denotes temperature distribution measuring means which is formed of an infrared camera using indium antimonide (InSb) or the like, as a sensor.

Reference numeral 5 denotes heating means having an infrared lamp 55a and a light condensing plate (a concave mirror) 5b. The heating means 5 controls the temperature distribution of the optical element from the top surface of the optical element 2. The light condensing plate 5b increases the directivity of infrared rays emitted from the infrared lamp 5a.

Reference numeral 7 denotes another heating means having a heat generating portion 7a in which resistance wires are arranged in a net form and a drive portion 7b for driving the heat generating portion 7a, which heating means controls the temperature distribution of the optical element from the bottom surface of the optical element 2; reference numeral 8 denotes a thermocouple employed as a temperature distribution measuring means which measures the temperature distribution of the bottom surface of the optical element 2; reference numeral 9 denotes control means which controls the two heating means 5 and 7 on the basis of signals from the two temperature distribution measuring means 4 and 8 so that the temperature distribution of the optical element 2 is uniform and the optical element stable without being deformed; and reference numeral 10 denotes a plurality of refrigerant flow passages buried in the light condensing mirror, which passages function as coolers of the light condensing mirror.

In this embodiment, the shape of a cross-section of a beam perpendicular to the radiation light 1 at the position where the radiation light 1 is incident to the light condensing mirror 2 is approximately 80×8 mm. The radiation light 1 is incident to the light condensing mirror 2 at a visual angle of 10° (an incident angle of 80°). The power of the incident light was determined to be approximately 120 W when observing an increase in the temperature of a copper block when the light was irradiated onto it for a fixed amount of time. The radiation light 1 is obliquely incident to the optical element 2, causing the irradiation area on the optical element 2 to be larger. In this embodiment, the heat load density is approximately 33 mW/mm$^2$.

Figure 2:
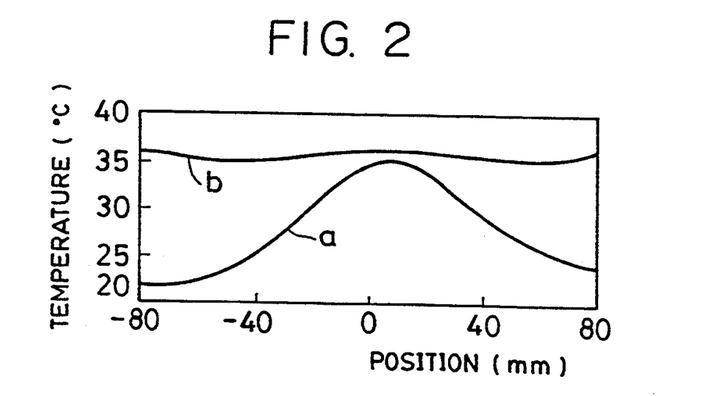
FIG. 2 is a graph showing the surface temperature distribution of an optical element shown in FIG. 1.

The length of the optical element 2 is 200 mm in the dimension parallel to the incidence of the radiation light 1 and 100 mm in the direction substantially perpendicular thereto. When the temperature distribution of the surface of the optical element 2 is measured by the infrared camera 4, it is found that the temperature distribution is as indicated by curve "a" in FIG. 2 in the longitudinal direction on the optical element 2, and a substantially uniform temperature distribution in the direction perpendicular thereto.

At this time, the size of a spot at a focus position at which the light 1 reflected from the optical element 2 is converged is approximately 7 mm in diameter when it is evaluated by a photosensitive film method.

Next, the heating means 5 having a long type infrared lamp 5a is placed at the position shown in FIG. 1. The heating means 5 is heated so that the temperature on the surface of the optical element 2 becomes as uniform as possible by adjusting the infrared condensing plate 5b and the irradiation power. After this adjustment, the temperature distribution on the surface of the optical element 2 becomes a substantially uniform temperature distribution of 35° as indicated by curve "b" in FIG. 2. The diameter of the spot of the reflected light beam at the focus position of the radiation light 1 is approximately 4 mm.

Next, electric current is supplied to the heating means 7 on the bottom surface of the optical element 2. The amount of electric current supplied to the heating means 7 is adjusted by the control section 9 while the temperature of the bottom surface of the optical element 2 is controlled by using the thermocouple 7a. At this time, the temperatures on the top and bottom surfaces of the optical element 2 are approximately 40°. Under these conditions, the diameter of the spot of the reflected beam at the focus position of the optical element 2 is approximately 2 mm. Light condensing performance almost equivalent to that designed was obtained.

As described above, the temperature distribution of the optical element 2 in this embodiment is properly controlled, thus easily obtaining excellent optical performance while preventing the optical element from changing shape. Even though the optical element of this embodiment is illustrated with a light condensing mirror (a concave mirror), other optical elements applicable to the present invention may be used including lenses, reflection mirrors, beam splitters, polarization plates, spectrocrystals, diffraction gratings, optical filters, etalon, multilayer film mirrors, masks for exposure apparatuses, reticles, etc. Any of the above optical elements can be used for optical apparatuses used with a high-intensity light source, such as SR light or excimer lasers.

One or two-dimensional infrared sensor arrays, in addition to infrared cameras, can be used for temperature distribution measuring means for optical elements. Also, in a case where a thermocouple or a temperature measuring element, such as a platinum resistor, can be buried within the optical element or attached to the top or bottom surface thereof, a plurality of these temperature measuring elements may be disposed. This is a preferable arrangement because the temperature distribution of an optical element can be determined satisfactorily.

Regarding the infrared lamp used as a means for heating optical elements, the shape of the lamp is selected according to the shape of the temperature distribution of the optical element. Also, a part of the optical element can be heated efficiently by using a light condensing mirror, an aperture or the like. The irradiation wavelength of the infrared lamp should preferably be selected in such a way that it does not match the wavelength of the light used in the optical apparatus, because the incidence of unwanted light can be prevented. The direction of the irradiation is selected so that it does not disturb the optical system of the optical apparatus, thus preventing the deterioration of the optical performance.

In a case in which heating elements, such as heating wires, can be buried within the optical element or attached to the top or bottom surface thereof, a plurality of heating elements may be disposed in a predetermined portion of the optical element. This is a preferable arrangement because portions of the optical element can be heated independently and the temperature distribution uniformly controlled.

When light is irradiated onto an optical element in this embodiment, first the temperature distribution of the optical element is measured by using the temperature distribution measuring means. Next, a predetermined part of the optical element is heated by using heating means so that the temperature distribution becomes uniform and the change of the shape of the optical element due to heat strain is minimized. Regarding the amount of heating, temperature distribution is measured repeatedly and data is analyzed by the control means and fed back to the heating means in order to properly adjust the heating.

When the temperature distribution data from the control means is fed back to the heating means, deformation of the optical element due to uneven temperature distribution may be calculated by calculating means, such as a finite element method, in order to determine a heating method by which the optical element attains an optimum shape, and the amount of deformation may be fed back to the heating means.

In particular, in a reflection type optical element, heat flows in from the top surface thereof by the irradiation of light from a light source, causing an uneven temperature distribution with the bottom surface of the optical element. For this reason, it is difficult to eliminate deformation of the optical element by merely making the temperature distribution of the top surface of the optical element uniform. Accordingly, it is desirable that heating means in the present invention be provided on both the top and bottom surfaces of the reflection type optical element as described above. This provision enables the temperature distribution on the optical element to be more uniform and to reduce the deformation of the optical element.

Although the temperature distribution of the optical element in this embodiment is made uniform by primarily using heating means, cooling means may also be used. In FIG. 1, the temperature distribution of the optical element is made uniform by controlling the flow rate and/or temperature of a refrigerant which is fed into the independent refrigerant passages 10a to 10e buried within the optical element.

The optical element can be partially cooled by burying or attaching a plurality of cooling elements which utilize the Peltier effect in the optical element. Since the Peltier element can directly and electrically control the amount of cooling, it is effective for making the temperature distribution uniform by feeding back signals from an infrared camera and is a highly responsive cooling means.

By using the above-mentioned heating and cooling means together, finer temperature control can be achieved, and temperature distribution can be made more uniform.

Second Embodiment

Figure 3:
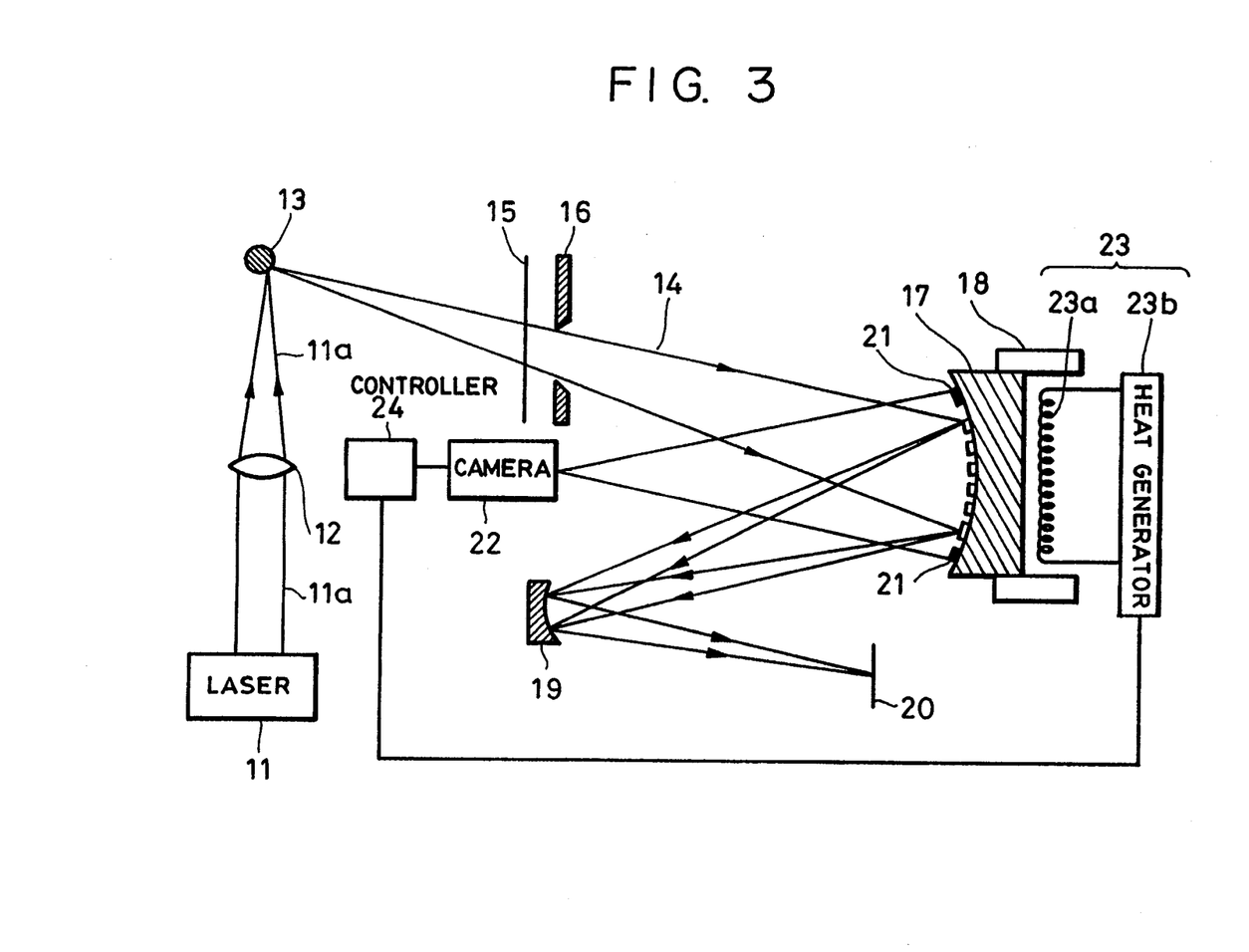
FIG. 3 is a schematic view illustrating an essential portion of a second embodiment of the present invention.

FIG. 3 is a schematic view of the second embodiment of the present invention which is applied to a reduction projection exposure apparatus for manufacturing semiconductor devices which uses a laser plasma X-ray source as a light source.

Reference numeral 11 denotes an excimer laser. A light beam 11a from the excimer laser 11 is condensed by a lens 12 and irradiated onto a target 13 made of a samarium (Sm) material. This irradiation causes a laser plasma X-ray 14 to be generated from the target 13. The X-ray 14 generated from the target 13 is passed through a filter 15 made of beryllium and an aperture 16 and is irradiated onto a reflection type mask 17 serving as an optical element. The X-rays reflected by the reflection type mask 17 are reflected by a demagnification mirror 19 and formed into an image of the mask 17 on a wafer position 20. Reference numeral 18 denotes a holder which holds the reflection type mask 17 and also cools it; reference numeral 21 denotes heating means, having platinum resistance wires deposited in a ring belt formed on the surface of the reflection type mask 17, which heats the surface of the mask 17; reference numeral 22 denotes an infrared camera; reference numeral 23 denotes another heating means which heats the reverse surface of the reflection type mask 17; and reference numeral 24 denotes control means which controls heating means 23 based on a signal from infrared camera 22.

A soft X-ray reflection pattern having a multilayer film coated thereon by the method proposed in Japanese Patent Laid-Open No. 1-175731 is formed on the surface of the reflection type mask 17 in this embodiment. The shape of the surface is changed to a curved shape to minimize optical aberration. A demagnification optical system using a plurality of mirrors may also be used for the demagnification mirror 19. The surface of the demagnification mirror 19 is coated with a multilayered film so that radiation having the same wavelength as soft X-rays reflected by the reflection type mask 17 are reflected. The demagnification factor of the demagnification mirror 19 is 1/5. In this embodiment, soft X-rays having a central wavelength of 130 Å of X-rays of various wavelengths generated from the laser plasma X-ray source are used.

Figure 4:
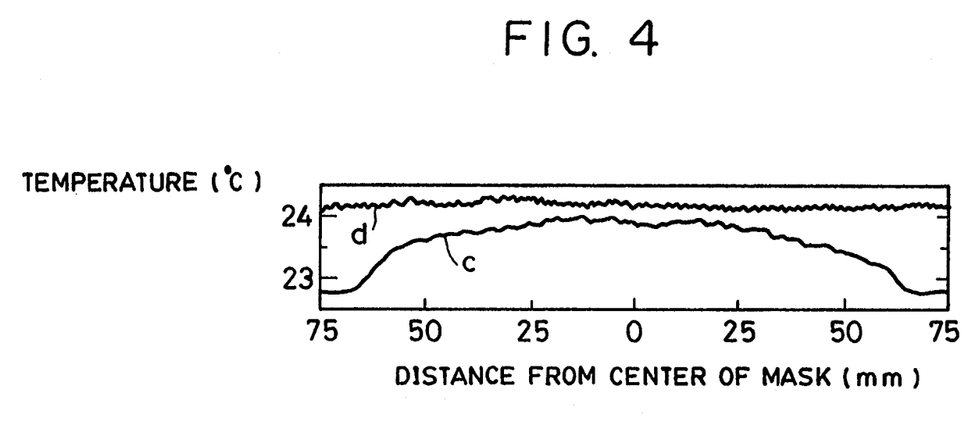
FIG. 4 is a graph showing the surface temperature distribution of a reflection type mask shown in FIG. 3.

X-rays are generated from the samarium target 13 by setting the excimer laser energy to be 50 mj/pulse and the repetition frequency to be 300 Hz, and irradiated onto the surface of the reflection type mask 17. The curve c in FIG. 4 indicates the temperature distribution on the surface of the mask measured at this time by an infrared camera 22. As shown in FIG. 4, the temperature distribution is almost symmetrical, and it can be noted that the temperature in the central portion of the mask is 1.2° C. greater than in the peripheral portion.

When the image of the mask is formed on the wafer on which a resist is applied at the wafer position 20 or thereabout and evaluated at this time, there is an aberration of approximately 10 $\mu$m on the focal plane, and there is also a maximum image distortion of 0.01%.

Next, when electric current is supplied to the platinum resistance wires 21 on the reflection type mask 17 and to a heater 23a of the heating means 23 on the bottom of the mask 17, and when the amount of heating is adjusted while being monitored by the infrared camera 22, the substantially uniform temperature distribution indicated by the curve "d" in FIG. 4 is obtained. When the image formed condition is evaluated at this time by the same method as described above, there is an aberration of less than 2 $\mu$m on the focal plane, and there is also an image distortion of less than 0.002%.

According to the embodiment described above, a method of stabilizing shapes of optical elements provides excellent advantages such that the amount that the shape of an optical element changes due to a non-uniform temperature increase is minimized and the deterioration of the optical performance of the optical element and the entire optical system is prevented. In addition, an optical apparatus using this method, can be achieved by providing temperature distribution measuring means and heating means for optical elements and by making the temperature distribution uniform during the light irradiation onto the optical element.

The present invention can be effectively applied to an optical apparatus having a high-intensity light source, such as a synchrotron radiation light source or a laser plasma X-ray source, the technology of which has been lately remarkably developed, and features that destruction of optical elements due to heat strain can be effectively prevented.

Third Embodiment

Figure 5:
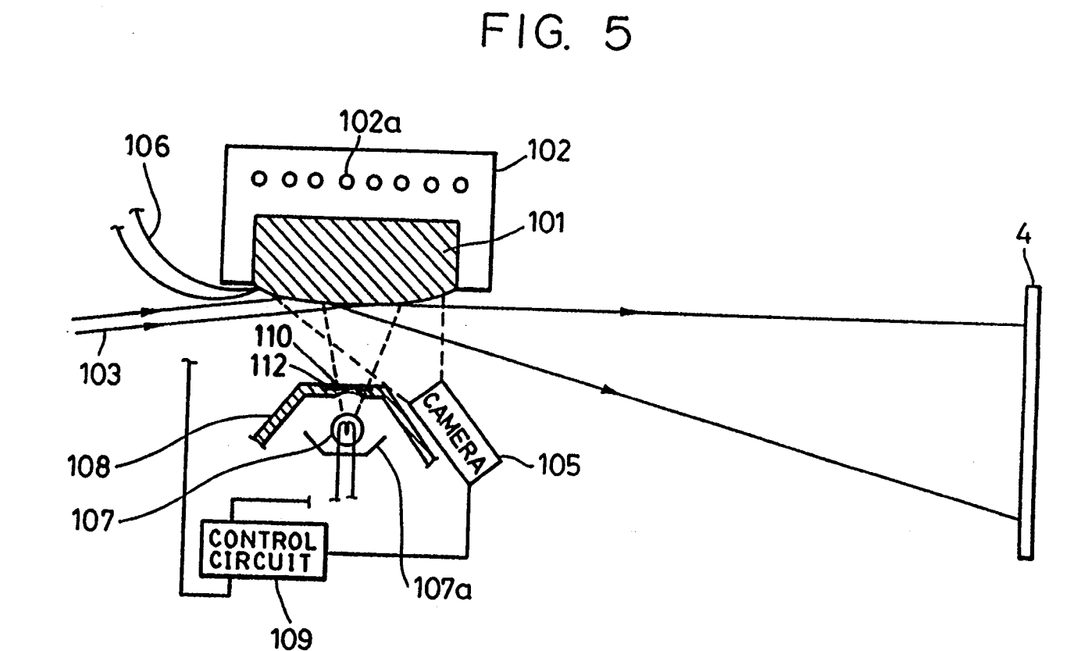
FIG. 5 is a schematic view illustrating a third embodiment of the present invention.

FIG. 5 is a schematic view illustrating the third embodiment. A convex mirror 101, which is a member of an X-ray exposure apparatus to be illuminated, is supported by a mirror holder 102 having a plurality of refrigerant flow passages 102a with its reflection surface facing downward. Synchrotron radiation light (hereinafter referred to as "X-rays") radiated from a light emitting point (not shown) of a charged particle storage ring (hereinafter referred to as an "SOR ring") is reflected and expanded by the reflection surface of convex mirror 101. The expanded X-rays expose a perpendicularly held wafer 104. Since the exposure time control shutter for adjusting the exposure amount of the wafer 104 and masks are well known, an illustration of them is omitted in FIG. 5.

The temperature distribution on the mirror 101 is detected by a measuring means, such as an infrared camera 105. The detected value is corrected by a thermocouple 106 mounted on a portion where X-rays from the reflection surface of the mirror 101 are not incident. A temperature control apparatus for controlling the temperature distribution on the reflection surface of the mirror 101 comprises heating means, such as an infrared heater 107, a reflection plate 107a and a temperature control means, such as an aperture 108. The aperture 108 partially reduces or shuts off heat radiated from an infrared heater 107 by means of an adjustable opening 110 and an infrared absorbing filter 112 disposed in the opening. The above opening and infrared absorbing filter are controlled on the basis of the values detected by the infrared camera 105 and the thermocouple 106. A predetermined temperature distribution is generated on the reflection surface of the mirror 101 by controlling the distribution of heat which reaches the reflection surface of the mirror 101 from the infrared heater 107. A control circuit 109 controls the output of the infrared heater 107 on the basis of the output from the infrared camera 105 and the thermocouple 106.

Next, an explanation will be given about an experiment carried out using the apparatus shown in FIG. 5.

Figure 6:
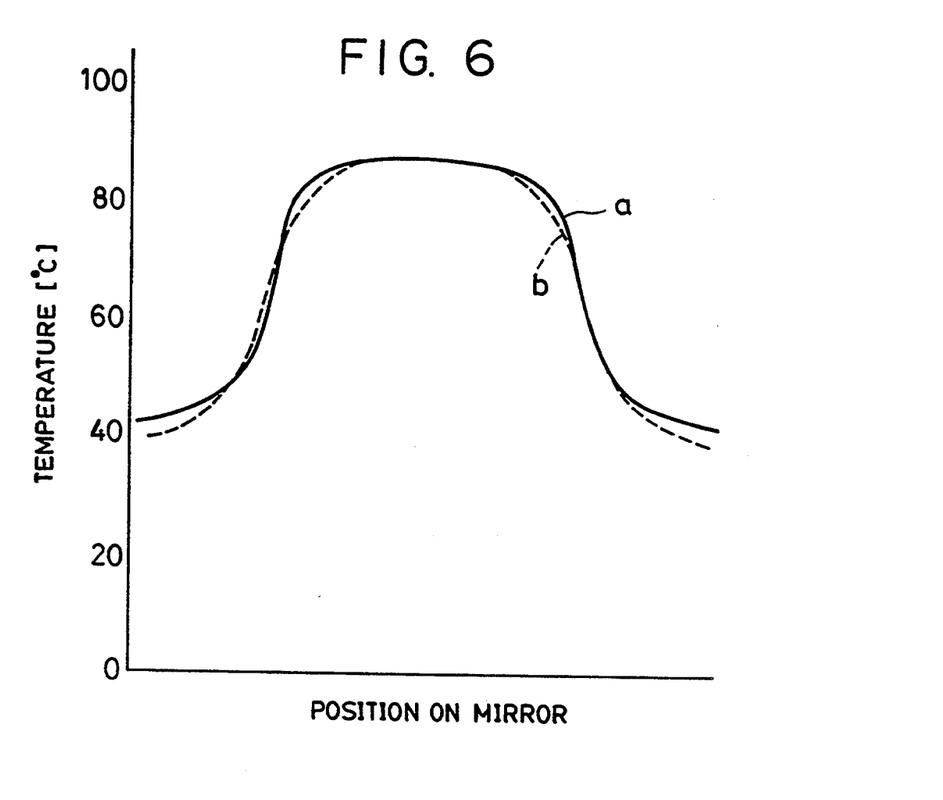
FIG. 6 is a graph showing the temperature distribution of the reflection surface of a mirror.
Figure 7:
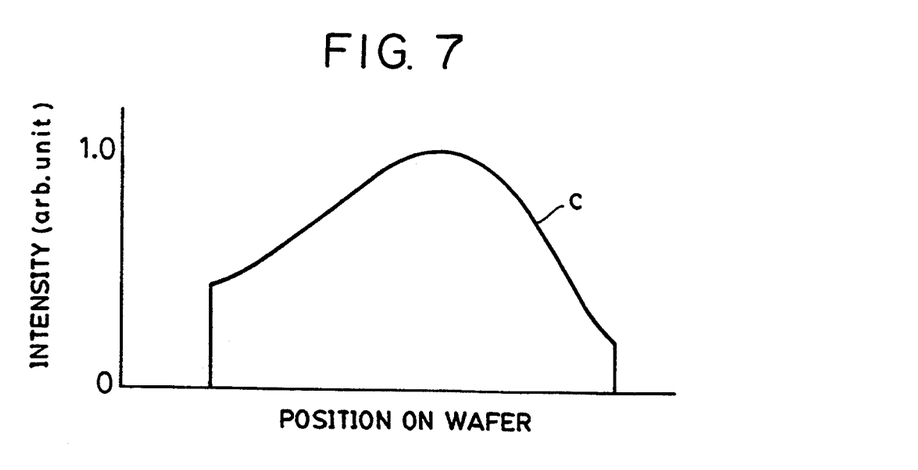
FIG. 7 is a graph showing an X-ray intensity distribution on a wafer.

X-rays radiated from an SOR ring having an accumulated current of 215 mA entered the reflection surface of a mirror having a curvature of 50 m at an incident angle of 2°. After a lapse of approximately one hour from the start of irradiation, the results of the temperature distribution on the reflection surface of the mirror and the distribution of the intensity of X-rays enlarged by the reflection surface and measured at the position of the wafer 104 are respectively shown by the solid line curve "a" in FIG. 6, and by the curve "c" in FIG. 7. The average energy absorbed by the mirror at this time was 50 mW/mm$^2$.

Next, the irradiation of X-rays was stopped and the mirror returned to room temperature. After the opening of the aperture and the infrared absorbing filter were adjusted on the basis of the curve "a" in FIG. 6, the reflection surface of the mirror was heated by the infrared heater. After it was confirmed that the temperature distribution on the reflection surface thereof was thermally stable matching the curve "a" in FIG. 6, the irradiation of X-rays was restarted, at the same time the heating by the infrared heater was stopped. Immediately after this, the temperature distribution on the reflection surface of the mirror and the intensity distribution of X-rays were measured again. The measured result of the temperature distribution are shown by the dashed-line curve "b" in FIG. 6. The results of measuring the intensity distribution of X-rays was substantially in agreement with the curve "c" in FIG. 7. At this time, the accumulated current of the SOR ring was 207 mA and the average energy absorbed by the mirror was 48 mW/mm$^2$.

As can be understood from the above-described experiment, if the temperature distribution on the mirror's reflection surface reached the thermally stable state described above, a predetermined X-ray intensity distribution can be obtained without requiring a long standby time for thermal adjustment.

If X-ray exposure is continued, the X-ray intensity is lowered on the whole by the attenuation of the accumulated current of the SOR ring. However, in this embodiment, a decrease in temperature of the mirror's reflection surface is detected by continually monitoring the temperature on the surface by using an infrared camera and a thermocouple during X-ray exposure. Deformations of the reflection surface due to heat strain is prevented by adding heat from the infrared heater by means of the control circuit.

When X-ray intensity is lowered on the whole, all that is necessary is to increase the output of the infrared heater because the curved shape of the temperature distribution hardly changes though the overall temperature on the reflection surface of the mirror is lowered.

In this embodiment, the heating and cooling means can be used together in the same manner as in the first embodiment. This can be achieved by controlling the flow rate and temperature of each refrigerant in a plurality of refrigerant flow passages 102a.

Fourth Embodiment

Figure 8:
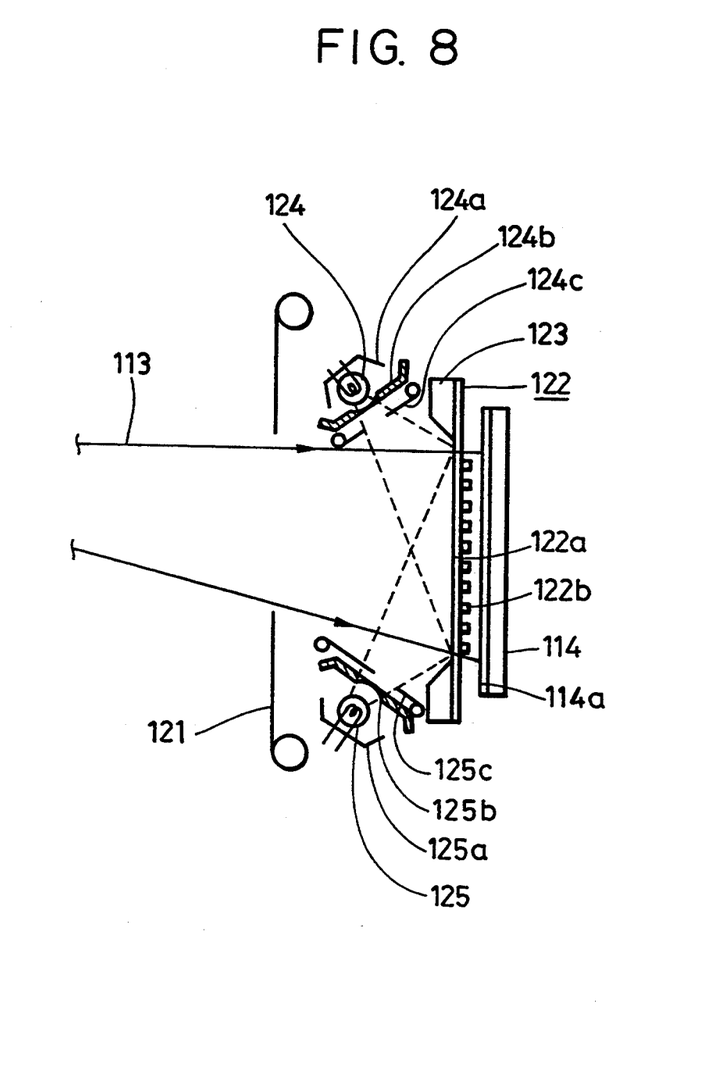
FIG. 8 is a schematic view illustrating a fourth embodiment of the present invention.

FIG. 8 is a schematic view illustrating the fourth embodiment. In the same manner as in the third embodiment, the temperature distribution of a mirror of an X-ray exposure apparatus is controlled, and a decrease in accuracy due to heat strain of a mask which is a member to be illuminated is prevented by using the same means as the means for controlling the temperature distribution on the reflection surface of the mirror.

An X-ray enlarged by the same mirror (not shown) as in the third embodiment is passed through an opening of an exposure time control shutter 121 and irradiated onto a mask 122 formed of an X-ray transmission film 122a and an X-ray absorbing body 122b, thereby printing the mask pattern 122b on a resist 114a of a wafer 114. The mask 122 is supported by a mask support body 123. The temperature control apparatus for controlling the temperature distribution on the photosensitive surface of the mask 122 comprises an apparatus (not shown) for detecting the temperature distribution of a temperature detecting device, such as an infrared camera, heating means, such as a pair of infrared heaters 124 and 125, reflecting plates 124a and 125a disposed in the infrared heaters 124 and 125, respectively, and temperature control means, such as apertures 124b and 125b, or shutters 124c and 125c. Both the apertures 124b and 125b are the same as those in the first embodiment. They are controlled by the output of a temperature detecting device, such as the aforesaid infrared camera, and cause a predetermined temperature distribution to be generated on the photosensitive surface of the mask 122.

The shutters 124c and 125c are moved in linkage with the exposure time control shutter 121 for controlling the exposure time at each position of the mask 122 and are controlled in such a way that only the surface of the mask 122 where X-rays are shut off by the exposure time control shutter 121 is selectively heated by the infrared heaters 124 and 125. That is, nonuniform temperatures which are periodically generated on the photosensitive surface of the mask 122 by the exposure time control shutter 121 are corrected by the shutters 124c and 125c of the infrared heaters 124 and 125, respectively.

Exposure was performed with the distance between a mask and a wafer being set at 70 μm, and using a mask having a gold absorbing body formed on an X-ray transmission film of silicon nitride having a thickness of 2 μm. The pattern strain of the exposed wafer was 0.08 μm. Next, when an experiment was performed under the same conditions as described above without using the means for controlling the temperature distribution of the mask, the pattern strain was 0.023 μm.

Fifth Embodiment

Figure 9:
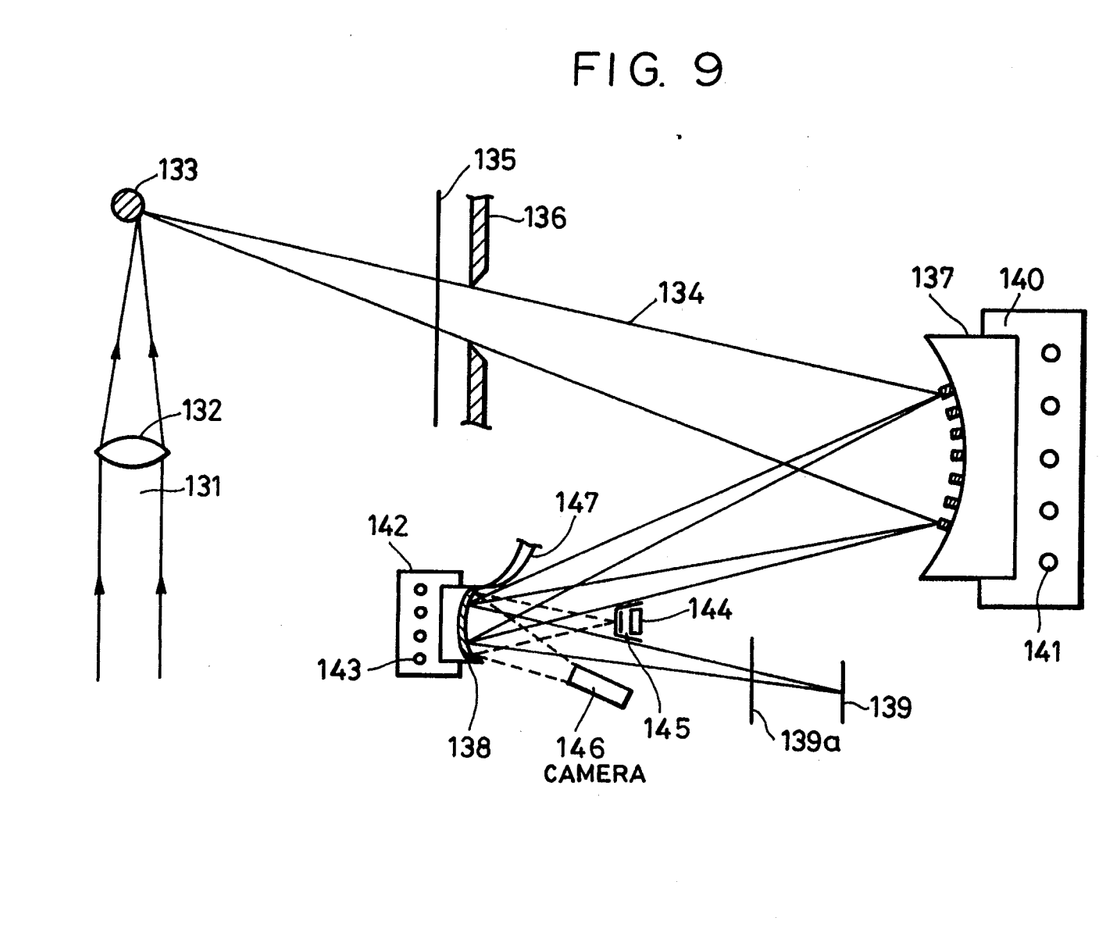
FIG. 9 is a schematic view illustrating a fifth embodiment of the present invention.

FIG. 9 illustrates the fifth embodiment. A member to be illuminated of this embodiment is a demagnification mirror of a soft X-ray reduction projection exposure apparatus.

An excimer laser light beam 131 is condensed by a lens 132 and irradiated onto a target 133 made of a samarium (Sm) material, causing a laser plasma X-ray 134 to be generated from the target 133. The X-ray 134 passes through a silicon filter 135 and an aperture 136 and is irradiated onto a reflection type mask 137. Furthermore, the X-ray 134 reflected by the reflection type mask 137 is reflected by a demagnification mirror 138, is passed through a shutter 139a, and forms the image of the reflection type mask 137 on a wafer 139. A holder 140 of the reflection type mask 137 has a plurality of refrigerant flow passages 141 for cooling the reflection type mask 137. The demagnification mirror 138 is similarly cooled indirectly by a plurality of refrigerant flow passages 143 of a mirror holder 142.

The temperature distribution on the photosensitive surface of the demagnification mirror 138 is measured by a measuring means, such as an infrared camera 146. The measured value is corrected by a thermocouple 147 arranged adjacent to the photosensitive surface of the demagnification mirror 138. The heating means, such as a glow bar lamp 144, heats the photosensitive surface of the demagnification mirror 138. Heat radiated from the glow bar lamp 144 is partially shut off or reduced by an aperture 145 which is the same as that of the first embodiment, causing a predetermined temperature distribution to be generated on the photosensitive surface of the demagnification mirror 138.

The operation of this embodiment is as described below.

First, the temperature distribution on the photosensitive surface of the demagnification mirror 138 in a thermally stable state of the demagnification mirror 138 while the wafer 139 is being exposed is measured by the infrared camera 146 and the thermocouple 147. The shift of a focus position due to the heat strain of the demagnification mirror 138 in this condition is measured. At the start of exposing the wafer 139, the aperture 145 is adjusted according to the measured temperature distribution on the photosensitive surface of the demagnification mirror 138, and the position of the wafer 139 is adjusted according to the shift of the focus position of the demagnification mirror 138. It is confirmed that the photosensitive surface of the demagnification mirror 138 has reached a predetermined temperature distribution by heating by the glow bar lamp 144, and thereafter exposure is initiated.

Since the demagnification mirror 138 is in a substantially thermally stable state at the start of exposure, standby time for thermal adjustment is hardly required. In addition, since a positional shift of the focus due to the heat strain of the demagnification mirror 138 is corrected, no blurring of a transfer pattern occurs.

In this embodiment, the heating and cooling means can be used together by controlling the flow rate and temperature of a refrigerant in each of the flow passages 141 and 143.

In the third and fourth embodiments, since a mirror and a mask, both of which are members to be illuminated, are made of a silicon carbide (SIC) material, the photosensitive surface of the members to be illuminated can be effectively heated by using an infrared lamp which emits infrared rays having a wavelength of 2 to 30 μm for an infrared heater.

In the fifth embodiment, since a demagnification mirror, which is a member to be illuminated, is made of quartz, quartz having a low heat conduction coefficient can be effectively heated by using a glow bar lamp which emits infrared rays having a wavelength of or above 4 μm.

Sixth Embodiment

An explanation will be given below about a method for manufacturing semiconductor devices by using the exposure apparatus described above.

Figure 10:
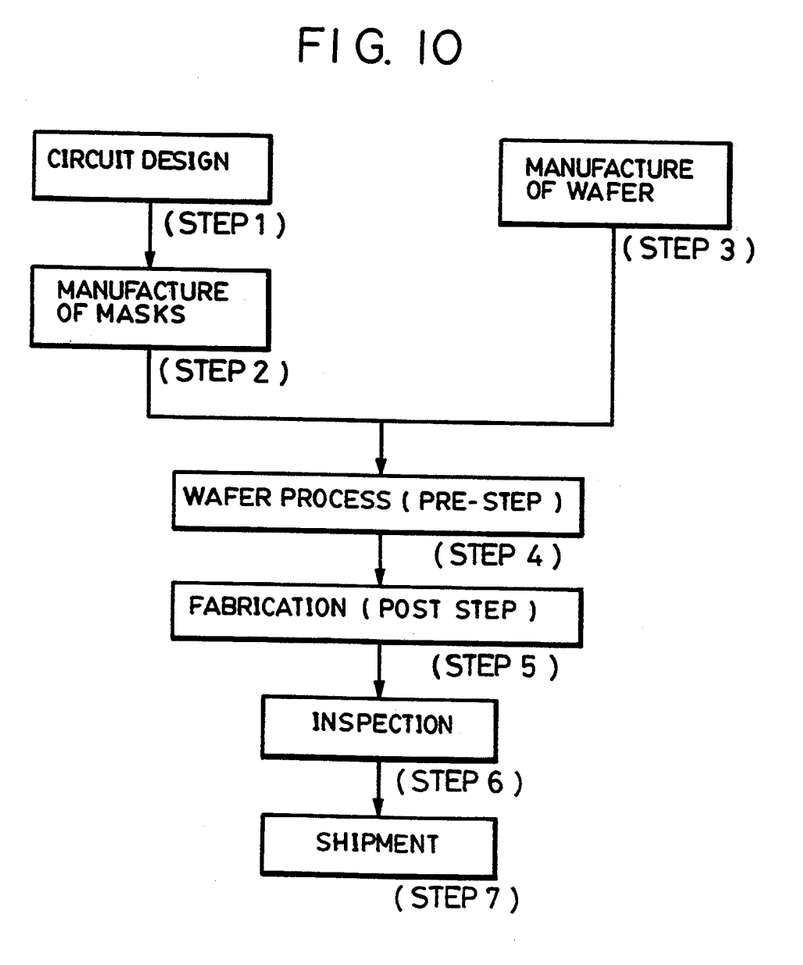
FIG. 10 is a flowchart showing the sequence of manufacturing semiconductor devices.

FIG. 10 is a flowchart showing the sequence of the operation of manufacturing semiconductor devices (semiconductor chips, such as integrated circuits (ICs) or large scale integrated circuits (LSI circuits), liquid-crystal panels, or charge-coupled devices (CCDs)). Referring to the flowchart shown in FIG. 10, in step 1 (circuit design), circuits of semiconductor devices are designed. In step 2 (manufacture of masks), masks having designed circuit patterns formed thereon are manufactured. In step 3 (manufacture of wafers), wafers are manufactured by using materials, such as silicon. Step 4 (wafer process) is called a pre-step, whereby actual circuits are formed on wafers by lithography technology by using the masks and wafers produced as described above. The subsequent step 5 (fabrication) is called a post step, whereby semiconductors are formed into chips by using the wafers manufactured in step 4. This step includes an assembly step (dicing, bonding), a packaging step (enclosing chips), and the like. In step 6 (inspection), an inspection test for confirming the operations of semiconductor devices manufactured in step 5, or a durability test, is performed. Semiconductor devices are completed through the processes described above and shipped (step 7).

Figure 11:
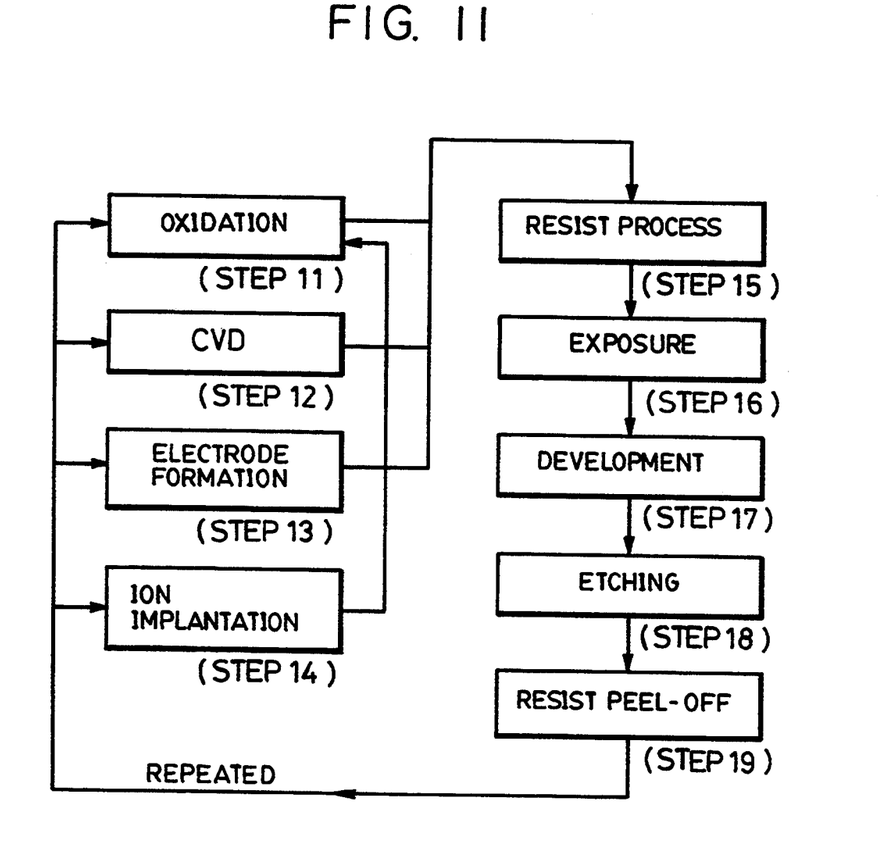
FIG. 11 is a detailed flowchart showing the sequence of a wafer process.

FIG. 11 shows a detailed flowchart for the wafer process. In step 11 (oxidation), the surface of the wafer is oxidized. In step 12 (chemical vapor deposition (CVD)), an insulating film is formed on the surface of the wafer. In step 13 (electrode formation), electrodes are formed on the wafer by deposition. In step 14 (ion implantation), ions are implanted into the wafer. In step 15 (resist process), a photosensitizing agent is applied to the wafer. In step 16 (exposure), a circuit pattern of the mask is printed and exposed to the wafer by means of the exposure apparatus described above. In step 17 (development), the exposed wafer is developed. In step 18 (etching), portions other than the developed resist image are etched. In step 19 (resist peel-off), resists which become unnecessary after etching is performed are removed. By performing these steps repeatedly, a circuit pattern is formed on the wafer in multilayered form.

Highly-integrated semiconductor devices which are difficult to manufacture before can be manufactured by the use of the manufacturing method of this embodiment.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the claims. The following claims are to be accorded a broad interpretation, so as to encompass all possible modifications and equivalent structures and functions.

What is claimed is:

1. A method of stabilizing a shape of a reflective surface of a reflection-type object, comprising the steps of:

measuring a temperature distribution of the reflective surface irradiated with radiation energy; and causing the temperature of a part of the reflective surface to be changed on the basis of the measurement to control the change of shape of the object, wherein the temperature is changed by irradiating infrared rays onto the reflective surface and adjusting an intensity distribution Of the infrared rays.

2. A method of stabilizing a shape of a reflective surface of a reflection-type object, comprising the step of:

determining a temperature distribution of the reflective surface in a thermally stable state; and controlling the temperature distribution of the reflective surface being irradiated with radiation energy to be the same as the temperature distribution in the thermally stable state, wherein the temperature distribution is controlled by irradiating infrared rays onto the reflective surface and adjusting an intensity distribution of the infrared rays.

3. An optical apparatus, comprising:
a reflection-type optical element having a reflective surface;
irradiating means for irradiating said optical element with radiation energy;
measuring means for measuring the temperature distribution of the optical element; and
temperature control means for changing the temperature of a part of said optical element on the basis of the measurement by said measuring means, wherein
said temperature controlling means comprises an infrared heater which irradiates infrared rays onto the reflective surface and adjusting means for adjusting an intensity distribution of the infrared rays.

4. An optical apparatus according to claim 3, wherein said adjusting means includes a member for absorbing the infrared rays.

5. An optical apparatus according to claim 3, wherein said temperature control means comprises a cooler.

6. An optical apparatus according to claim 3, wherein said heater is disposed on a rear side of said irradiated optical element.

7. An exposure apparatus, comprising:
transfer means for exposing and transferring an exposure pattern to an object to be exposed by irradiating exposure energy onto a reflection-type mask having a front side with the exposure pattern formed thereon and a rear side;
measuring means for measuring the temperature distribution of the mask; and
temperature control means for changing the temperature of part of the mask on both the front and rear sides on the basis of the measurement by said measuring means.

8. An apparatus according to claim 7, wherein the reflection-type mask comprises a mirror with the exposure pattern formed on its surface.

9. An exposure apparatus, comprising:
transfer means for exposing and transferring an exposure pattern to an object to be exposed by irradiating exposure energy onto a reflection-type mask having an exposure pattern formed thereon;
measuring means for measuring the temperature distribution of the mask; and
temperature control means for changing the temperature of part of the mask on the basis of the measurement by said measuring means, wherein
said temperature control means comprises an infrared heater which irradiates infrared rays onto the mask and adjusting means for adjusting an intensity distribution of the infrared rays.

10. An exposure apparatus according to claim 9, wherein the reflection-type mask comprises the exposure pattern formed on a surface of a mirror.

11. An exposure apparatus according to claim 9, wherein the exposure pattern includes a circuit pattern of a semiconductor device.

12. A method of manufacturing semiconductor devices, comprising the steps of:
preparing a reflection type mask having a circuit pattern formed thereon;
measuring the temperature distribution of the mask;
changing the temperature of a part of the mask on the basis of the measurement to obtain a substantially uniform temperature distribution of the mask; and
exposing and transferring a circuit pattern of the mask onto a wafer by irradiating the mask with exposure energy, wherein
the temperature of part of the mask is changed by irradiating infrared rays onto the mask and adjusting an intensity distribution of the infrared rays.

13. A method of manufacturing semiconductor devices, comprising the steps of:
preparing a reflection type mask having a circuit pattern formed thereon;
determining a temperature distribution of the mask in a thermally stable state when the mask is being irradiated before the mask is irradiated with exposure energy; and
exposing and transferring a circuit pattern of the mask onto a wafer by irradiating the mask with exposure energy, wherein
the temperature distribution is controlled by irradiating infrared rays onto the mask and adjusting an intensity distribution of the infrared rays.

14. Semiconductor devices manufactured by a manufacturing method comprising the steps of:
preparing a reflection type mask having a circuit pattern formed thereon;
measuring the temperature distribution of the mask;
changing the temperature of a part of the mask on the basis of the measurement to obtain a substantially uniform temperature distribution of the mask; and
exposing and transferring a circuit pattern of the mask onto a wafer by irradiating the mask with exposure energy, wherein
the temperature of part of the mask is changed by irradiating infrared rays onto the mask and adjusting an intensity distribution of the infrared rays.

15. Semiconductor devices manufactured by a manufacturing method comprising the steps of:
preparing a reflection type mask having a circuit pattern formed thereon;
determining a temperature distribution of the mask in a thermally stable state when the mask is being irradiated before the mask is irradiated with exposure energy; and
exposing and transferring a circuit pattern of the mask onto a wafer by irradiating the mask with exposure energy, wherein
the temperature distribution is controlled by irradiating infrared rays onto the mask and adjusting an intensity distribution of the infrared rays.

16. An optical apparatus, comprising:
a reflection-type optical element having a front side with a reflective surface and a rear side;
irradiating means for irradiating said optical element with radiation energy;
measuring means for measuring temperature distribution of the optical element on both the front and rear sides; and
temperature control means for changing the temperature of part of said optical element on the basis of the measurement by said measuring means.

17. An apparatus according to claim 16, wherein said temperature control means comprises at least one of a heater and a cooler.

18. An exposure apparatus, comprising:

transfer means for exposing and transferring an exposure pattern to an object to be exposed by irradiating exposure energy onto a reflection-type mask having a front side with the exposure pattern formed thereon and a rear side;

measuring means for measuring temperature distribution of the mask on both the front and rear sides; and temperature control means for changing the temperature of part of the mask on the basis of the measurement by said measuring means.

19. An apparatus according to claim 18, wherein the reflection-type mask comprises a mirror with the exposure pattern formed on its surface.

20. An optical apparatus, comprising:

a reflection-type optical element having a front side with a reflective surface and a rear side;

irradiating means for irradiating said optical element with radiation energy;

measuring means for measuring the temperature distribution of said optical element; and temperature control means for changing the temperature of part of said optical element on both the front and rear sides on the basis of the measurement by said measuring means.

21. An apparatus according to claim 20, wherein said temperature control means comprises at least one of a heater and a cooler.

* * * * *

UNITED STATES PATENT AND TRADEMARK OFFICE
CERTIFICATE OF CORRECTION

PATENT NO. : 5,390,228
DATED : February 14, 1995
INVENTOR(S) : Niibe et al.

It is certified that error appears in the above-indentified patent and that said Letters Patent is hereby corrected as shown below: Title page item:

[56] REFERENCES CITED:

FOREIGN PATENT DOCUMENTS, "1175731 7/1989 Japan." should read --1-175731 7/1989 Japan--.

COLUMN 4:

Line 15, "numeral i" should read --numeral 1--.
Line 29, "lamp 55a" should read --lamp 5a--.

COLUMN 7:

Line 52, "50 mj/pulse" should read --50 mJ/pulse--.

COLUMN 12:

Line 61, "Of" should read --of--.
Line 63, "step" should read --steps--.

Signed and Sealed this

Twentieth Day of June, 1995

Attest:

BRUCE LEHMAN

*Attesting Officer*       *Commissioner of Patents and Trademarks*